United States Patent [19]
Domenicucci et al.

[11] Patent Number: 6,022,801
[45] Date of Patent: Feb. 8, 2000

[54] METHOD FOR FORMING AN ATOMICALLY FLAT INTERFACE FOR A HIGHLY DISORDERED METAL-SILICON BARRIER FILM

[75] Inventors: Anthony G. Domenicucci, New Paltz; Lynne M. Gignac, Beacon; Yun-Yu Wang, Poughquag; Horatio S. Wildman; Kwong Hon Wong, both of Wappingers Falls, all of N.Y.

[73] Assignee: International Business Machines Corporation, Armonk, N.Y.

[21] Appl. No.: 09/025,718

[22] Filed: Feb. 18, 1998

[51] Int. Cl.$^7$ ................................................ H01L 21/283
[52] U.S. Cl. ..................... 438/653; 438/655; 438/656; 438/660; 438/683
[58] Field of Search ..................... 438/648, 649, 438/660, 683, 653, 655, 682, 685, 643, 666, 656, 658

[56] References Cited

U.S. PATENT DOCUMENTS

| | | | |
|---|---|---|---|
| 5,047,367 | 9/1991 | Wei et al. | 437/200 |
| 5,094,981 | 3/1992 | Chung et al. | 437/190 |
| 5,250,467 | 10/1993 | Somekh et al. | 438/192 |
| 5,302,552 | 4/1994 | Duchateau et al. | 438/664 |
| 5,389,575 | 2/1995 | Chin et al. | 437/190 |
| 5,395,798 | 3/1995 | Havemann | 438/200 |
| 5,457,069 | 10/1995 | Chen et al. | 438/190 |
| 5,482,895 | 1/1996 | Hayashi et al. | 437/200 |
| 5,510,295 | 4/1996 | Cabral, Jr. et al. | 437/200 |
| 5,536,676 | 7/1996 | Cheng et al. | 437/162 |
| 5,567,652 | 10/1996 | Nishio | 437/200 |
| 5,780,362 | 7/1998 | Wang et al. | 438/683 |
| 5,828,131 | 10/1998 | Cabral, Jr. et al. | 257/757 |

OTHER PUBLICATIONS

IBM Docket No. BU9–93–016V entitled Low Temperature Formation of Low Resistivity Titanium Silicide now USPTO S/N 08/586,046, filed Jan. 16, 1996. See attached application as filed, pp. 1–26, w/Disclosure BU8–95–0143 pp. 1–18, w/Figures 1–7 on 5 pages of drawings.

*Primary Examiner*—Wael Fahmy
*Assistant Examiner*—Kurt Eaton
*Attorney, Agent, or Firm*—Ratner & Prestia; Jay H. Anderson

[57] ABSTRACT

A method for forming a conductive contact having an atomically flat interface is disclosed. A layer containing cobalt and titanium is deposited on a silicon substrate and the resulting structure annealed in a nitrogen containing atmosphere at about 500° C. to about 700° C. A conductive material is deposited on top of the structure formed on anneal. A flat interface, which prevents diffusion of conductive materials into the underlying silicon substrate is formed. The method can be used to form contacts for very small devices and shallow junctions, such as are required for ULSI shallow junctions.

18 Claims, 4 Drawing Sheets

METHOD FOR FORMING AN ATOMICALLY FLAT INTERFACE FOR A HIGHLY DISORDERED METAL-SILICON BARRIER FILM

TECHNICAL FIELD

This invention relates to the formation of conductive contacts in the fabrication of semiconductor integrated circuits. More particularly, this invention relates to a method for forming an atomically flat interface that prevents diffusion of the conductive material into the underlying semiconductor layer.

BACKGROUND OF THE INVENTION

The continuing increase in semiconductor device circuit speed and density has been accompanied both by a decrease in the vertical dimensions of devices and by a need for reliable dense wiring. The decrease in vertical dimension has produced shallower device junctions.

In the processing of integrated circuits, individual devices, which are comprised of silicon, are connected into circuits by subsequent metal layers. Great care must be given to the metal to silicon interface, because the metal/silicon junction is prone to certain problems that require process attention. Two such problems are high-ohmic connections, which may electrically look like open circuits, and poisoning of the device by the contacting metal.

In formation of an interconnect, a contact hole is formed in an insulating layer, typically silicon dioxide, to expose the underlying semiconductor substrate, typically a N+ region set in a P– well, or a P+ region set in a N– well. To form the interconnect, the appropriate metal is deposited in the contact hole by standard techniques. If the metal is placed in direct contact with the semiconductor substrate, the metal can diffuse into the semiconductor during subsequent processing of the device, especially at temperatures above 400° C., which are encountered during device packaging.

Diffusion produces spiking of the metal into the semiconductor. Spiking typically extends for less than about 0.5 micron into the semiconductor, and thus is not a particular problem when the device is greater than 0.5 micron thick. However, for high density circuits, in which the device is less than 0.5 micron thick, spiking can short the metal to the underlying P– well or N– well, rendering the device inoperative.

Metal silicides are typically used to provide good ohmic contact to device junctions. Titanium silicide ($TiSi_2$) has become the most widely-used silicide for self-aligned silicide applications in the ULSI industry because of its low resistivity, its ability to be self-aligned, and its relatively good thermal stability. Titanium is deposited into the contact hole by standard deposition techniques. Silicidation is carried out by subsequently heating the substrate and metal to about 500° C. to 700°C.

To minimize junction leakage, the device junction must be kept below the silicide. This distance is determined by the amount of metal deposited in the contact hole, the amount of silicon consumed during heating, and the planarity of the reaction front during heating. The amount of silicon consumed is determined by the stoichiometry and crystal structure of the silicide formed as well as by the anneal time and anneal temperature. For titanium silicide the molar ratio of metal to silicon is two to one. The planarity of the silicide reaction front is controlled by many variables, such as the cleanliness of the silicon surface prior to metal deposition and the reaction temperature. Typical semiconductor fabrication sequences produce non-planar, cusped reaction fronts. Junction depths could be made shallower by using a silicidation process that consumed less silicon and/or produced a more nearly planar reaction front.

To prevent diffusion, many semiconductor fabrication sequences use a diffusion barrier between the metal and the silicon substrate. In a common process sequence, titanium nitride (TiN) is used as a barrier against attack by tungsten hexafluoride and by fluorine during the deposition of tungsten, a commonly used conductive material, by chemical vapor deposition from tungsten hexafluoride. A preferred method for forming the titanium nitride barrier is by carrying out the silicidation reaction in a nitrogen containing atmosphere, such as nitrogen gas, ammonia vapor, or forming gas. Titanium nitride is formed at the same time as titanium silicide.

The topography of the resulting interface limits the usefulness of this method in the development of smaller shallow junction devices. The method involves competing reactions in a very narrow region, formation of $TiO_xN_y$ from above and formation of $TiSi_2$ from below. Thus, it is difficult to control the layer thickness of the bilayer, and the layer is typically nitrogen deficient. Formation of the titanium silicide layer consumes silicon from the substrate and the layer can be cusped.

The rough interface between titanium suicides and silicon is not good for shallow junctions or small devices. The layer is an unreliable barrier against attack during the chemical vapor deposition of tungsten, which can lead to tungsten encroachment and ruin the device. Although the barrier properties of the layer can be improved by incorporation of oxygen during deposition of the titanium and the subsequent anneal, the non-uniformity in thickness of the $TiO_xN_y$ layer, which degrades its effectiveness as a barrier, remains a problem.

Nishio, U.S. Pat. No. 5,567,652, discloses a method in which (1) a silicon dioxide layer is formed on the surface of the silicon substrate; (2) a layer of titanium is deposited on the oxide layer; (3) a layer of cobalt is deposited on the titanium layer; and (4) the substrate is heat treated in a nitrogen containing atmosphere. On heat treatment the titanium reacts with the silicon dioxide to form silicon at the interface. Then, some of the cobalt migrates through the titanium to form a layer of $CoSi_2$ at the interface. The layer of $CoSi_2$ formed at the interface reflects the crystal orientation of the silicon substrate. Consequently, a very flat layer of $CoSi_2$ is formed at the interface. However, several additional steps are introduced into the processing sequence by this method. Initially, it is necessary to from the silicon dioxide layer. Two layers of metal, a layer of titanium and a layer of cobalt, must be individually deposited instead of a single layer of metal. Following heat treatment, it is necessary to remove both the oxygen containing titanium nitride layer formed during heat treatment and the unreacted cobalt layer before a metal can be deposited on the $CoSi_2$ layer. Removal of each of these layers requires a separate step.

Wei, U.S. Pat. No 5,047,367, discloses a process for the formation of a titanium nitride/cobalt silicide bilayer is formed by (1) depositing a layer of titanium on the silicon layer, (2) depositing a layer of cobalt on the titanium layer; and (3) annealing in a nitrogen containing atmosphere. An additional step, deposition of the cobalt layer, is required and the final temperature of the anneal is high, about 850–950° C.

Thus, a need exists for a method for forming a barrier layer and a silicide layer in which (1) formation of the silicide layer consumes less silicon than a disilicide; (2) the interface formed between the silicide layer and the silicon substrate is a flat interface, preferably an atomically flat interface; and (3) the barrier layer is uniform in thickness. In addition, the method should be readily integratable into the procedures currently used to form semiconductor devices, and preferably, does not introduce additional processing steps.

SUMMARY OF THE INVENTION

The invention is a method for forming a semiconductor device with electrical interconnections that have low contact resistance and for forming a barrier layer that prevents undesired diffusion into the silicon substrate. The method comprises:

a) depositing a layer consisting essentially of cobalt and titanium on a silicon substrate, wherein the amount of cobalt present in the layer does not exceed 20 atomic percent of the total amount cobalt and titanium present in the layer;

annealing the substrate and layer in a nitrogen containing atmosphere at about 500° C. to about 700° C.; and c) depositing a conductive material on the layer.

The method produces an atomically flat interface between the silicides and the silicon substrate. The flat interface is critical for contacts for very small devices and shallow junctions, such as are required for ULSI shallow junctions. The uniform $TiO_xN_y$ (titanium oxynitride, tioxynitride) layer formed by this method is a good barrier against attack by tungsten hexafluoride and fluorine during the chemical vapor deposition of tungsten.

While not being bound by any theory, it is believed that the cobalt in the titanium/cobalt alloy layer plays two roles during the annealing. First, the cobalt migrates to the silicon surface and slows down formation of the silicide. Second, because of differences in both atomic radius and electronic structure between the cobalt and titanium atoms, each of these atoms bonds differently to silicon. This difference in bonding to silicon destroys the long range spatial and electronic periodicity of the silicide crystal and allows formation of highly disordered nano-crystalline and/or amorphous silicide. The highly disordered silicide, in turn, forms an atomically flat interface between silicon and the silicide. Highly disordered silicide also causes formation of a uniformly thick $TiO_xN_y$ layer. Thus, a much more reliable barrier against attack of the silicon by metal or fluorine is created. In addition, a better controlled silicide interface, which is more suitable for contact in shallow junction applications, is formed.

In another embodiment, the invention is a contact in which the interface between the silicon substrate and its adjacent layer is atomically flat. In still another embodiment, the invention is a contact formed by the method of the invention.

BRIEF DESCRIPTION OF THE DRAWINGS

The invention can be more fully understood from the following description in connection with the accompanying drawings described as follows.

DETAILED DESCRIPTION OF THE INVENTION

The invention is a process for forming an atomically flat interface between a silicon substrate and a $(Ti,Co)Si_x/TiO_xN_y$ layer for use in self-aligned silicide technology and as a contact via fill. The layer serves as a barrier against attack on the silicon substrate during subsequent processing steps, such as attack by tungsten hexafluoride and fluorine during subsequent chemical vapor deposition of tungsten from tungsten hexafluoride.

Figure 1:
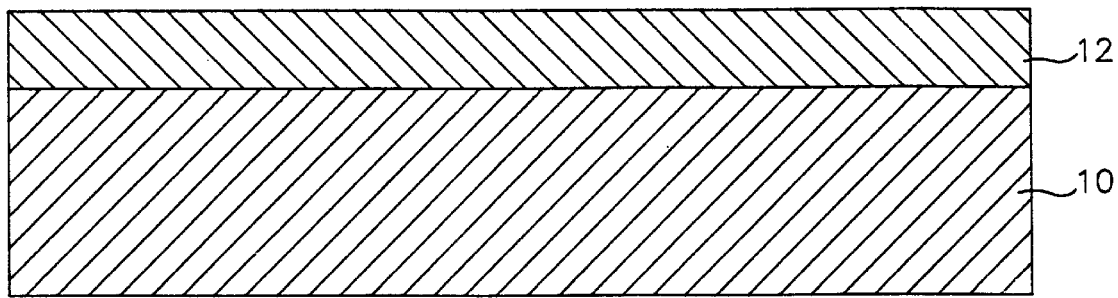
FIG. 1 shows a cross-section of a silicon substrate with a titanium/cobalt alloy layer formed thereon.

Referring to FIG. 1, silicon substrate 10 may be either mono-crystalline or poly-crystalline silicon. Using methods well known to those skilled in the art, such as are described, for example, in *The Science and Engineering of Microelectronic Fabrication*, S. A. Campbell, Oxford University Press, New York, 1996, the silicon substrate can be provided, for example, by formation of a contact hole, or via, in the dielectric layer over the region of a silicon substrate at which a connection is desired. Typically, the contact hole is formed over a N+ region set in a P− well or a P+ region set in a N− well.

Titanium/cobalt alloy layer 12 is deposited on the surface of silicon substrate 10 by any one of several techniques known in the art. Deposition techniques include, for example, physical vapor deposition, chemical vapor deposition, plasma-enhanced chemical vapor deposition, flash evaporation, sputtering, electron beam evaporation, and ion assisted deposition. The apparatus and techniques for vacuum deposition are well known to those skilled in the art.

The titanium and the cobalt may be deposited from different sources or from a source of titanium that also contains cobalt. For example, if the layer is deposited by sputtering, a sputtering target of titanium and cobalt is prepared such that a titanium layer containing the desired atomic percentage of cobalt is deposited on the silicon substrate. Alternatively, the layer can be deposited by co-sputtering titanium and cobalt such that a titanium film containing the desired atomic percentage of cobalt is deposited on the silicon substrate. When the physical vapor deposition process of evaporation is used, the titanium and cobalt are deposited from two different sources at appropriate rates to achieve the desired atomic percentage of cobalt. Other processes known in the art may also be used to deposit titanium/cobalt alloy layer 12.

The amount of cobalt present in titanium/cobalt alloy layer 12 should not exceed about 20 atomic percent of the total amount cobalt and titanium present in the layer, typically about 0.1 to about 20 atomic percent cobalt. The layer preferably contains about 1 to about 10 atomic percent cobalt, more preferably about 3 to about 7 atomic percent cobalt, and most preferably about 5 atomic percent cobalt.

Titanium/cobalt alloy layer 12 typically has a thickness of about 5 nm to about 100 nm, preferably about 5 nm to about 30 nm, more preferably about 5 nm to about 20 nm. Most preferably, the titanium/cobalt alloy layer is about 6 nm to about 10 nm thick.

Following deposition of titanium/cobalt alloy layer 12, substrate 10 and layer 12 are annealed in a nitrogen containing atmosphere, such as ammonia vapor, forming gas (a mixture of nitrogen and hydrogen), or nitrogen gas. The time and temperature are selected to ensure formation of the (Ti,Co)Si$_x$ and TiO$_x$N$_y$ layers. Annealing may be carried out at about 500° C. to about 700° C. for about 0.5 hr to about 2 hr. Above about 700° C. agglomeration of the (Ti,Co)Si$_x$ is observed. Preferably annealing is carried out at about 550° C. for about 0.5 hr. Annealing may be carried out by methods well known to those skilled in the art, such as in a conventional annealing furnace or by rapid thermal anneal.

Figure 2A:
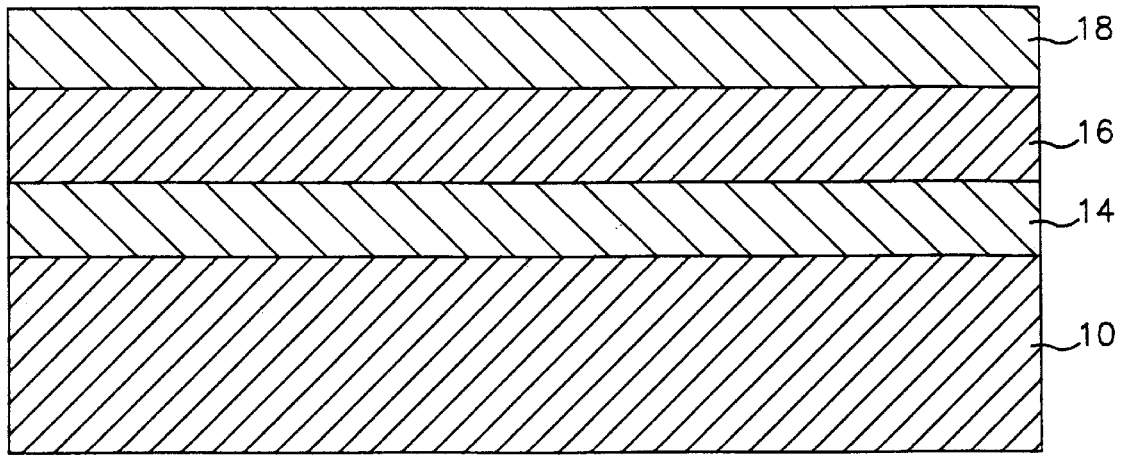
FIG. 2a shows a cross-section of the multi-layer structure formed on anneal

FIG. 2a shows the multi-layer structure formed on anneal. The multi-layer structure consists of silicon substrate 10, CoSi$_x$ layer 14, highly disordered (Ti,Co)Si$_x$ layer 16, and TiO$_x$N$_y$ layer 18.

During the initial stages of anneal, the titanium present in titanium/cobalt alloy layer 12 removes any silicon dioxide present on the surface of silicon substrate 10. Generally, this oxide layer is only about 0.1 to 0.5 nm (1 to 5 A) thick. Silicon dioxide dissolves into the titanium. The oxygen is subsequently rejected by the growing silicide layer into TiO$_x$N$_y$ layer 18.

During anneal, cobalt in the (titanium/cobalt) alloy migrates to the silicon/(titanium/cobalt) alloy boundary while silicon and the (titanium/cobalt) alloy form alloyed silicide. Within the (Ti,Co)Si$_x$ layer, cobalt segregates toward the interface between silicon and the alloyed silicide layer and forms CoSi$_x$ layer 14 at the boundary between the silicon and the alloyed silicide layer. Cobalt silicide layer 14 is believed to be about a mono-layer thick. It has been detected by transmission electron microscope analyses, nano-probe electron energy loss spectroscopy, and energy dispersive X-ray analysis.

The cobalt remaining in the silicide layer destroys the long range spatial and electronic periodicity of the silicide crystal producing a highly disordered layer of silicide. "Highly disordered" means that (Ti,Co)Si$_x$ layer 16 is either nano-crystalline and/or amorphous. As is well known to those skilled in the art, nano-crystalline means there is some localized, short range order in the layer, typically about a few nanometers, while amorphous means there is no order in the layer greater than a few A. Highly disordered (Ti,Co)Si$_x$ layer 16 causes formation of an atomically flat interface between silicon substrate 10 and highly disordered silicide layer 16.

Due to segregation of the cobalt during anneal, the amount of cobalt in highly disordered (Ti,Co)Si$_x$ layer 16 is greater that the amount present in titanium/cobalt alloy layer 12. The amount of cobalt in highly disordered silicide layer 16 is typically about 0.2 to about 35 atomic percent, preferably about 2 to about 15 atomic percent, more preferably about 5 to about 10 atomic percent, and most preferably about 8 atomic percent, based on the total amount of cobalt and titanium present in layer 16. If the amount of cobalt in alloy layer 12 is about 5 atomic percent of the total amount of cobalt and titanium present in layer 12, the amount of cobalt in layer 16 is typically about 8 atomic percent of the total amount of cobalt and titanium present in layer 16.

Highly disordered (Ti,Co)Si$_x$ layer 16 is typically slightly more than half as thick as titanium/cobalt alloy layer 12. (Ti,Co)Si$_x$ layer 16 typically has a thickness of about 3 nm to about 60 nm, preferably about 3 nm to about 20 nm, more preferably about 3 nm to about 12 nm. Most preferably, the layer is about 4 nm to about 7 nm thick. When alloy layer 12 is about 9 nm thick, highly disordered silicide layer 16 is typically about 5 nm thick. Although the exact value of x depends on the conditions under which the layer is formed, i.e., amount of cobalt in layer 12, thickness of layer 12, anneal temperature, etc., x has a value between one and two.

The titanium in the titanium/cobalt alloy layer reacts with nitrogen in the nitrogen containing atmosphere and the oxygen that was present on the surface of the layer to form TiO$_x$N$_y$ layer 18. No detectable cobalt remains in TiO$_x$N$_y$ layer 18. Due to the atomically flat interface between silicon substrate 10 and (Ti,Co)Si$_x$ layer 16, TiO$_x$N$_y$ layer 18 is very uniform in thickness, which makes it a more reliable barrier against attack by metals and by fluorine during subsequent processing steps.

TiO$_x$N$_y$ layer 18 is typically slightly less than half as thick as titanium/cobalt alloy layer 12. Titanium oxynitride (tioxynitride) layer 18 typically has a thickness of about 2 nm to about 40 nm, preferably about 2 nm to about 15 nm, more preferably about 2 nm to about 8 nm. Most preferably, the layer is about 3 nm to about 6 nm thick. When alloy layer 12 is about 9 nm thick, titanium oxynitride layer 18 is typically about 4 nm thick.

The values of x and y depend on the reaction conditions and typically vary across the cross-section of the layer. Typically, the amount of oxygen near the interface with highly disordered (Ti,Co)Si$_x$ layer 16 is greater than the amount of oxygen at the surface, and the amount of nitrogen is greater at the surface is greater than the amount of nitrogen near the interface with layer 16.

Figure 2B:
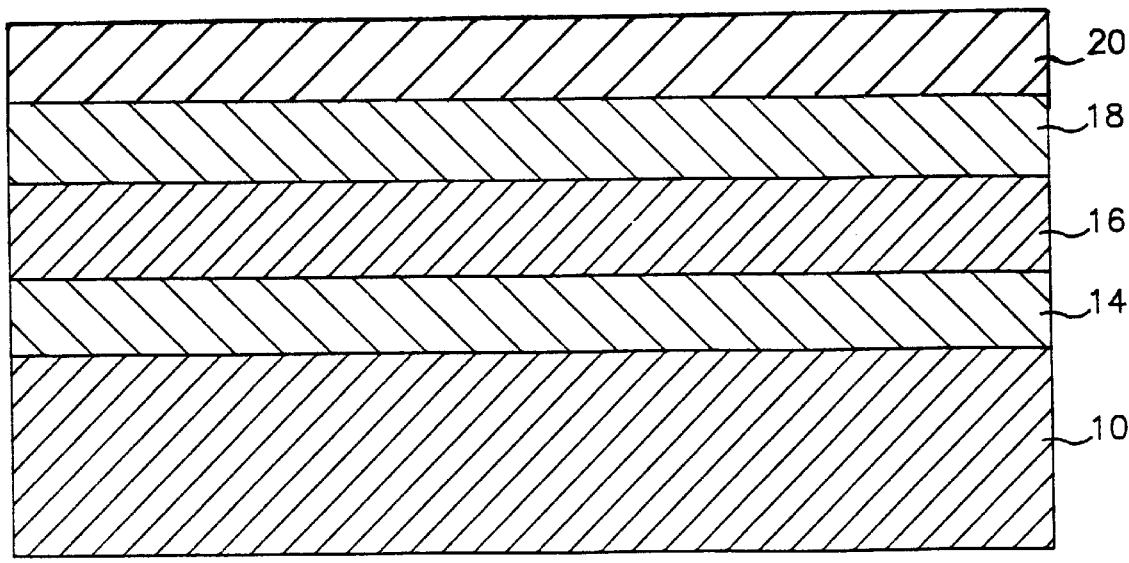
FIG. 2b shows a cross-section of a contact formed by the method of the present invention.

After anneal, it is unnecessary to remove any of the layers formed on anneal. A conductive material can be deposited directly on top of the interface by methods well known to those skilled in the art. Typical conductive materials include, for example, tungsten, aluminum, copper, gold, tantalum, aluminum/copper alloy, and aluminum/silicon/copper alloy. A preferred conductive material is tungsten. Tungsten may be deposited by chemical vapor deposition of tungsten hexafluoride (WF$_6$). FIG. 2b shows conductive material 20 over TiO$_x$N$_y$ layer 18.

The method may be readily integrated into present semiconductor fabrication techniques that currently use titanium silicide layers formed from undoped titanium.

INDUSTRIAL APPLICABILITY

The invention can be used in the manufacture of semiconductor devices, which are used in, for example, digital computers. The method produces an atomically flat interface for a tungsten barrier plug film, which provides an improved plug for ULSI shallow junctions. The junction can be used to form the source/drain elements for semiconductor devices.

The advantageous properties of this invention can be observed by reference to the following example which illustrates, but does not limit, the invention.

EXAMPLE

This example describes preparation of an interface by the method of the invention. Silicon substrate 10 was undoped monocrystalline silicon about 0.7 mm thick. However, doped silicon and polycrystalline silicon, typically a N+ region set in a P– well or a P+ region set in a N– well, can be used. A cobalt containing titanium layer was deposited on the silicon substrate by co-evaporation. The layer contained 5 atomic percent cobalt and was 10 nm thick. The substrate was annealed at 550° C. for 0.5 hr in nitrogen gas. Annealing was carried out in a conventional annealing furnace.

The resulting structure contains $TiO_xN_y$ layer 18, highly disordered. $(Ti,Co)Si_x$ layer 16, $CoSi_x$ layer 14, and silicon substrate 10. The structure was analyzed by TEM imaging, nano-probe analytical TEM with energy dispersive X-ray and electron energy loss spectroscopy, Auger, and X-ray diffraction.

Figure 3:
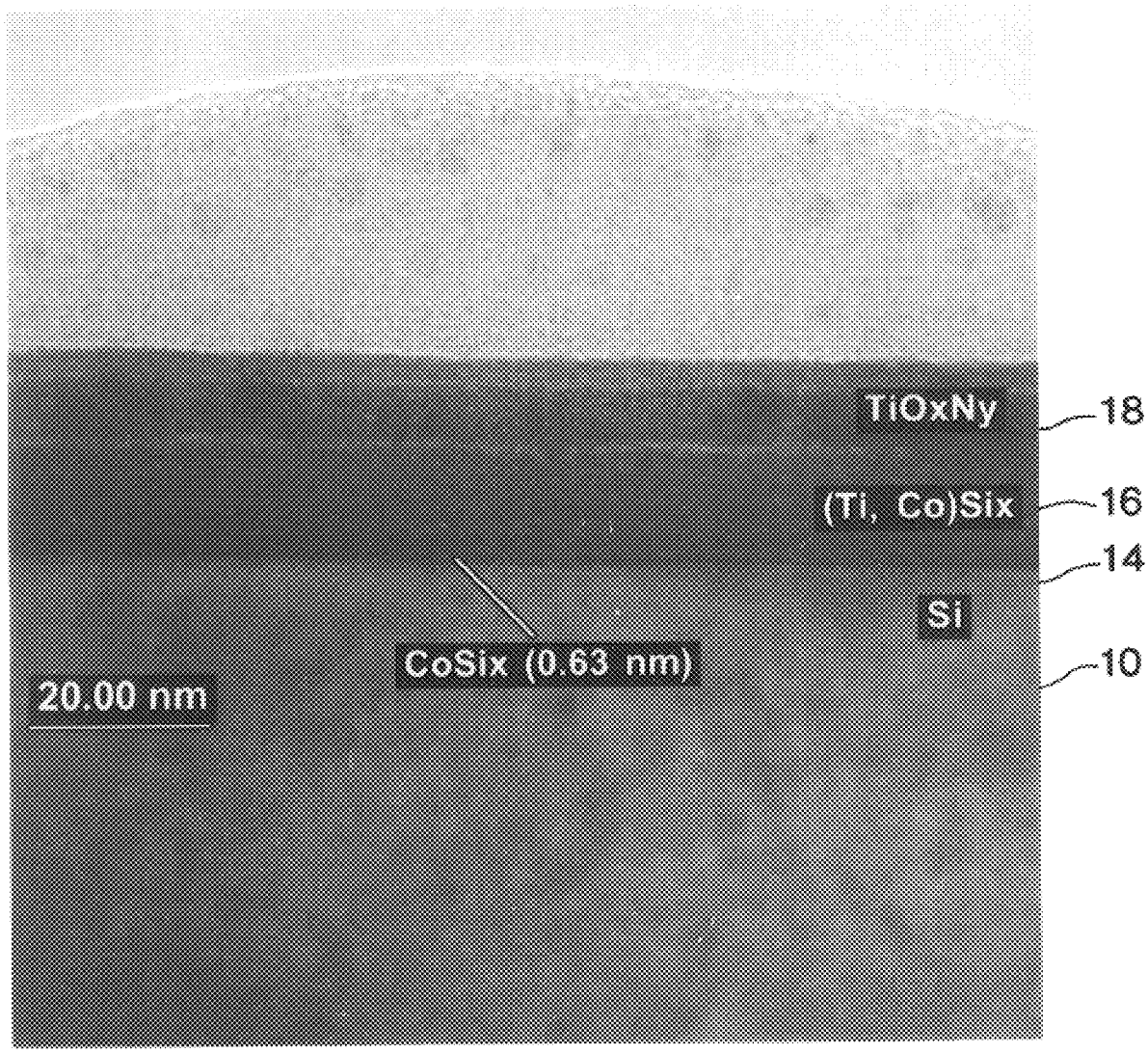
FIG. 3 shows a transmission electron microscopy micrograph of a cross-section of the multi-layer structure formed on anneal.
Figure 4:
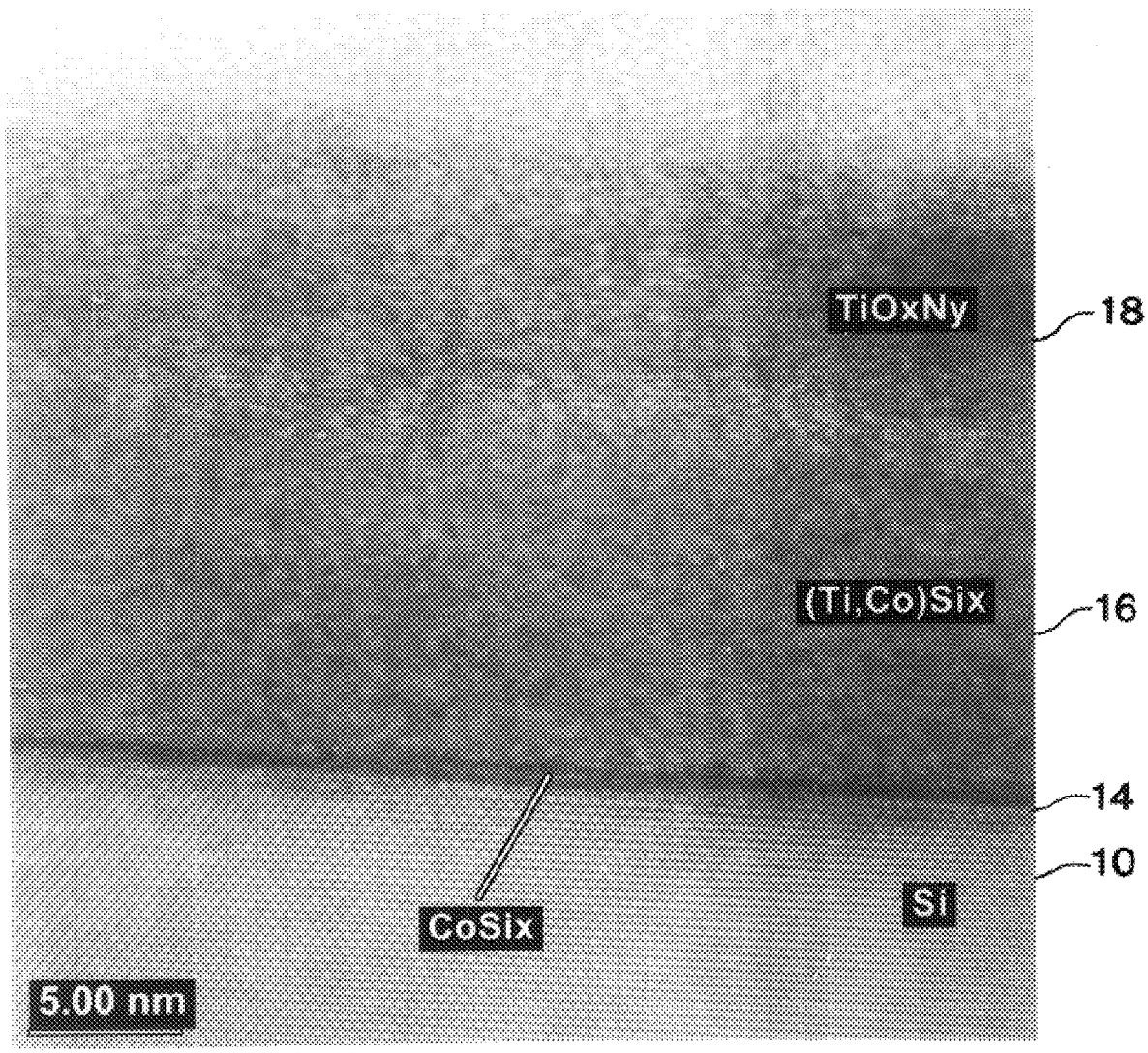
FIG. 4 shows at higher magnification the transmission electron microscopy micrograph of the cross-section of the multi-layer structure formed on anneal.

Transmission electron microscope analysis of a cross-section of the multi-layer structure formed on anneal is shown in FIG. 3 and FIG. 4. Visible are silicon substrate 10, $CoSi_x$ layer 14, highly disordered $(Ti,Co)Si_x$ layer 16, and $TiO_xN_y$ layer 18. As shown in the Figures, $CoSi_x$ layer 14 is about a mono-layer thick, having a thickness of about 0.63 nm (6.3 Å) and is atomically flat. The flat interface between silicon substrate 10 and $CoSi_x$ layer 14 and the flat interface between $CoSi_x$ layer 14 and highly disordered $(Ti,Co)Si_x$ layer 16 are also visible.

$CoSi_x$ layer 14 can also be detected by nano-probe electron energy loss spectroscopy and energy dispersive X-ray analysis.

Having described the invention, we now claim the following and their equivalents.

What is claimed is:

1. A method comprising:
    a) depositing a layer consisting essentially of cobalt and titanium on a silicon substrate, wherein the amount of cobalt present in the layer does not exceed about 20 atomic percent of the total amount of cobalt and titanium present in the layer; and
    b) annealing the substrate and layer in a nitrogen containing atmosphere at about 500° C. to about 700° C., whereby a highly disordered silicide layer containing cobalt, silicon, and titanium is formed on the silicon substrate, and an interface between the silicon substrate and the silicide layer is atomically flat.

2. The method of claim 1 wherein the layer is about 5 nm to about 100 nm thick.

3. The method of claim 2 in which the amount of cobalt present in the layer is about 1 to about 10 atomic percent, based on the total amount of cobalt and titanium present in the layer.

4. The method of claim 3 in which the layer is about 5 nm to about 20 nm thick and in which the amount of cobalt present in the layer is about 3 to about 7 atomic percent, based on the total amount of cobalt and titanium present in the layer.

5. The method of claim 4 in which the layer is about 6 nm to about 10 nm thick, in which the amount of cobalt present in the layer is about 5 atomic percent, and in which annealing is carried out at about 550° C. for about 0.5 to 2 hr.

6. The method of claim 1 additionally comprising, after step b):
    c) depositing a conductive material on the layer.

7. The method of claim 6 in which the layer is about 5 nm to about 100 nm thick.

8. The method of claim 7 in which the amount of cobalt present in the layer is about 1 to about 10 atomic percent, based on the total amount of cobalt and titanium present in the layer.

9. The method of claim 8 in which the layer of cobalt and titanium is deposited by a vacuum deposition technique.

10. The method of claim 6 in which the layer is about 5 nm to about 20 nm thick and in which the amount of cobalt present in the layer is about 3 to about 7 atomic percent, based on the total amount of cobalt and titanium present in the layer.

11. The method of claim 10 in which the conductive material is tungsten.

12. The method of claim 11 in which the layer is about 5 nm to about 100 nm thick and in which the amount of cobalt present in the layer is about 1 to about 10 atomic percent, based on the total amount of cobalt and titanium present in the layer.

13. The method of claim 12 in which the layer is about 5 nm to about 20 nm thick and in which the amount of cobalt present in the layer is about 3 to about 7 atomic percent, based on the total amount of cobalt and titanium present in the layer.

14. The method of claim 13 in which the layer is about 6 nm to about 10 nm thick, in which the amount of cobalt present in the layer is about 5 atomic percent, and in which annealing is carried out at about 550° C. for about 0.5 to 2 hours.

15. A contact prepared by the method of claim 6.

16. The contact of claim 15 in which the conductive material is tungsten.

17. The contact of claim 16 in which the layer is about 5 nm to about 100 nm thick and in which the amount of cobalt present in the layer is about 1 to about 10 atomic percent, based on the total amount of cobalt and titanium present in the layer.

18. The contact of claim 17 in which the layer is about 6 nm to about 10 nm thick; the amount of cobalt present in the layer is about 5 atomic percent; and annealing is carried out at about 550° C. for about 0.5 to 2 hr.

* * * * *

UNITED STATES PATENT AND TRADEMARK OFFICE
CERTIFICATE OF CORRECTION

PATENT NO. : 6,022,801
DATED : February 8, 2000
INVENTOR(S) : Anthony G. Domenicucci, Lynne M. Gignac, Yun-Yu Wang, Horatio S. Wildman, Kwong Hon Wong It is certified that error appears in the above-identified patent and that said Letters Patent is hereby corrected as shown below:

In column 2, line 27, "suicides" should be replaced with --silicides--;
In column 3, line 23, --b)-- should be inserted before "annealing";
In column 3, last line, a period should be inserted after "anneal";
In column 5, line 17, ":he" should be replaced with --the--;
In column 5, line 49, "that" should be replaced with --than--; and
In column 7, line 2 the period after "disordered" should be deleted.

Signed and Sealed this

Twentieth Day of March, 2001

*Attest:*

NICHOLAS P. GODICI

*Attesting Officer*     *Acting Director of the United States Patent and Trademark Office*